United States Patent
Heo et al.

(10) Patent No.: US 12,181,512 B2
(45) Date of Patent: Dec. 31, 2024

(54) SEMICONDUCTOR DEVICES COMPRISING FAILURE DETECTORS FOR DETECTING FAILURE OF BIPOLAR JUNCTION TRANSISTORS AND METHODS FOR DETECTING FAILURE OF THE BIPOLAR JUNCTION TRANSISTORS

(71) Applicant: Samsung Electronics Co., Ltd., Suwon-si (KR)

(72) Inventors: Donghun Heo, Suwon-si (KR); Himchan Park, Suwon-si (KR); Cheolhwan Lim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 120 days.

(21) Appl. No.: 17/984,332

(22) Filed: Nov. 10, 2022

(65) Prior Publication Data

US 2023/0296661 A1    Sep. 21, 2023

(30) Foreign Application Priority Data

Mar. 16, 2022  (KR) .................. 10-2022-0032989
May 11, 2022  (KR) .................. 10-2022-0057947

(51) Int. Cl.
  *G01R 31/26*    (2020.01)
  *G01R 19/10*    (2006.01)
  *H01L 27/06*    (2006.01)

(52) U.S. Cl.
  CPC ......... *G01R 31/2608* (2013.01); *G01R 19/10* (2013.01); *H01L 27/0647* (2013.01)

(58) Field of Classification Search
  CPC ............... G01R 31/2608; G01R 19/10; G01R 31/2619; H01L 27/0647; G01K 7/01; G01K 15/007

(Continued)

(56) References Cited

U.S. PATENT DOCUMENTS

| 5,289,111 A | 2/1994 | Tsuji |
| 5,399,988 A | 3/1995 | Knierim |

(Continued)

FOREIGN PATENT DOCUMENTS

| JP | 6698388 B2 | 5/2020 |
| KR | 101629180 B1 | 6/2016 |
| KR | 102234948 B1 | 3/2021 |

OTHER PUBLICATIONS

"Extended European Search Report dated Jul. 27, 2023, issued in corresponding European Application No. 23159073.8".

*Primary Examiner* — Giovanni Astacio-Oquendo
(74) *Attorney, Agent, or Firm* — Myers Bigel, P.A.

(57) ABSTRACT

A semiconductor device may include a voltage generator configured to generate a first base-emitter voltage of a first bipolar junction transistor, and a failure detector configured to generate a failure signal by comparing the first base-emitter voltage with an upper limit reference voltage and a lower limit reference voltage. The failure detector may include a second bipolar junction transistor a current source configured to generate a bias current, a first resistor coupled between the current source and a emitter of the second bipolar junction transistor to generate the upper limit reference voltage, a second resistor and a third resistor configured to divide a second base-emitter voltage of the second bipolar junction transistor to generate the lower limit reference voltage, and a first and second comparator configured to compare the first base-emitter voltage with the upper limit reference voltage and the lower limit reference voltage, respectively, to generate respective failure signals.

20 Claims, 13 Drawing Sheets

(58) Field of Classification Search
USPC .................. 324/762.08, 762.01, 537, 500
See application file for complete search history.

(56) References Cited

U.S. PATENT DOCUMENTS

| | | |
|---|---|---|
| 6,566,852 B2 | 5/2003 | Tagami et al. |
| 7,531,998 B2 | 5/2009 | Kim |
| 10,175,118 B1 | 1/2019 | Rezayee et al. |
| 10,969,814 B2 | 4/2021 | Dornseifer et al. |
| 2009/0043521 A1* | 2/2009 | Lin .................. G01K 7/01 |
| | | 702/136 |
| 2011/0221508 A1 | 9/2011 | Kang et al. |
| 2011/0255568 A1 | 10/2011 | Swei |
| 2015/0308902 A1* | 10/2015 | Sugiura .............. G01K 3/005 |
| | | 374/178 |
| 2017/0296056 A1* | 10/2017 | Hresko .............. A61B 5/0015 |
| 2020/0001048 A1* | 1/2020 | Oren .................. G06T 7/70 |
| 2020/0103289 A1 | 4/2020 | Horng et al. |
| 2020/0338351 A1* | 10/2020 | Panken ............ A61N 1/0534 |
| 2023/0228796 A1* | 7/2023 | Lim .................. G01K 7/01 |
| | | 374/100 |

\* cited by examiner

SEMICONDUCTOR DEVICES COMPRISING FAILURE DETECTORS FOR DETECTING FAILURE OF BIPOLAR JUNCTION TRANSISTORS AND METHODS FOR DETECTING FAILURE OF THE BIPOLAR JUNCTION TRANSISTORS

CROSS-REFERENCE TO RELATED APPLICATIONS

This application claims priority under 35 U.S.C. § 119 to Korean Patent Application No. 10-2022-0032989, filed on Mar. 16, 2022, and Korean Patent Application No. 10-2022-0057947, filed on May 11, 2022, in the Korean Intellectual Property Office, and the entire contents of each above-identified application are incorporated by reference herein.

TECHNICAL FIELD

Aspects of the inventive concepts relate to semiconductor devices, and more particularly, to semiconductor devices that include a detector for detecting an error or a failure of a bipolar junction transistor, and to methods for detecting a failure of a bipolar junction transistor.

BACKGROUND

Due to the development of fine processes, it may be possible to integrate more devices per unit area in a semiconductor chip. In addition, performance improvement of semiconductor chips is also accelerating. Due to improved performance and reduced line width, heat generated in a semiconductor device has a great influence on device stability. In particular, when a semiconductor device used in an electric system of a vehicle malfunctions due to factors such as voltage, current, and temperature, it may affect directly the life, comfort, and/or well-being of a driver. Accordingly, research on temperature management systems for ensuring the stability of the semiconductor device is being actively conducted.

A temperature sensor, which is a core component of a temperature management system, is generally implemented using a bipolar junction transistor BJT. More specifically, conventional bipolar junction transistor BJT based temperature sensors may sense the temperature using the emitter-base voltage VEB difference that varies according to the ratio of the amount of current flowing through the two BJTs.

In semiconductor devices using the bipolar junction transistor (BJT) as detectors or sensors, there are not many means for identifying the failure of the bipolar junction transistor BJT. A reference voltage is required to monitor whether the emitter-base voltage VEB of the bipolar junction transistor BJT is abnormal. In general, it is possible to determine whether the emitter-base voltage VEB is abnormal using a band-gap reference BGR. However, when monitoring the temperature-varying emitter-base voltage VEB using a fixed reference voltage, a large margin with respect to temperature must be considered. If a reference voltage with a large margin for temperature is used, the reliability of failure detection is inevitably lowered. For this reason, failure detection technology having high reliability even in the temperature change of the bipolar junction transistor BJT is being pursued.

SUMMARY

Some aspects of the present disclosure provides failure detectors and failure detection methods in semiconductor devices using a base-emitter voltage of bipolar junction transistor BJT that varies with temperature as a reference.

According to some embodiments of the inventive concept, a semiconductor device may include a voltage generator configured to generate a first base-emitter voltage of a first bipolar junction transistor, and a failure detector configured to generate a failure signal by comparing the first base-emitter voltage with an upper limit reference voltage and a lower limit reference voltage. The failure detector may include: a second bipolar junction transistor in which a base terminal and a collector terminal are grounded, a current source configured to generate a bias current, a first resistor coupled between the current source and an emitter terminal of the second bipolar junction transistor to generate the upper limit reference voltage, a second resistor and a third resistor configured to divide a second base-emitter voltage of the second bipolar junction transistor to generate the lower limit reference voltage, a first comparator configured to compare the first base-emitter voltage with the upper limit reference voltage and configured to generate a first failure signal, and a second comparator configured to compare the first base-emitter voltage with the lower limit reference voltage and configured to generate a second failure signal.

According to some embodiments of the inventive concepts, a semiconductor device may include a first bipolar junction transistor configured to generate a first base-emitter voltage, a second bipolar junction transistor configured to generate a second base-emitter voltage, a reference generator configured to generate at least one reference voltage based on the second base-emitter voltage, and a comparator configured to compare the generated at least one reference voltage and the first base-emitter voltage and generate a failure signal based on the comparison.

According to some embodiments of the inventive concepts, a method for detecting a failure in a semiconductor device using a bipolar junction transistor may include generating a first base-emitter voltage from a first bipolar junction transistor, generating a second base-emitter voltage from a second bipolar junction transistor, generating an upper limit reference voltage and a lower limit reference voltage from the second base-emitter voltage, and determining a failure of the first bipolar junction transistor by comparing the first base-emitter voltage with the upper limit reference voltage or the lower limit reference voltage.

BRIEF DESCRIPTION OF THE FIGURES

The above and other objects and features of the present disclosure will become apparent by describing in detail embodiments thereof with reference to the accompanying drawings.

DETAILED DESCRIPTION

It is to be understood that both the foregoing brief summary and the following detailed description are merely examples, and it is to be considered that additional description of the inventive concepts is provided herein. Reference signs are indicated in detail in preferred embodiments of the present inventive concepts, examples of which are indicated in the reference drawings. Wherever possible, the same reference numbers are used in the description and drawings to refer to the same or like parts.

In the following, the advantages of the present inventive concepts will be described with examples of sensors and/or detectors using a bipolar junction transistor (BJT). However, those skilled in the art will readily appreciate other advantages and capabilities of the present inventive concepts in accordance with the teachings herein. The present inventive concepts may be implemented or applied through other embodiments. Moreover, the detailed description may be modified or changed without departing significantly from the scope, spirit and other objects of the present inventive concepts.

Figure 1:
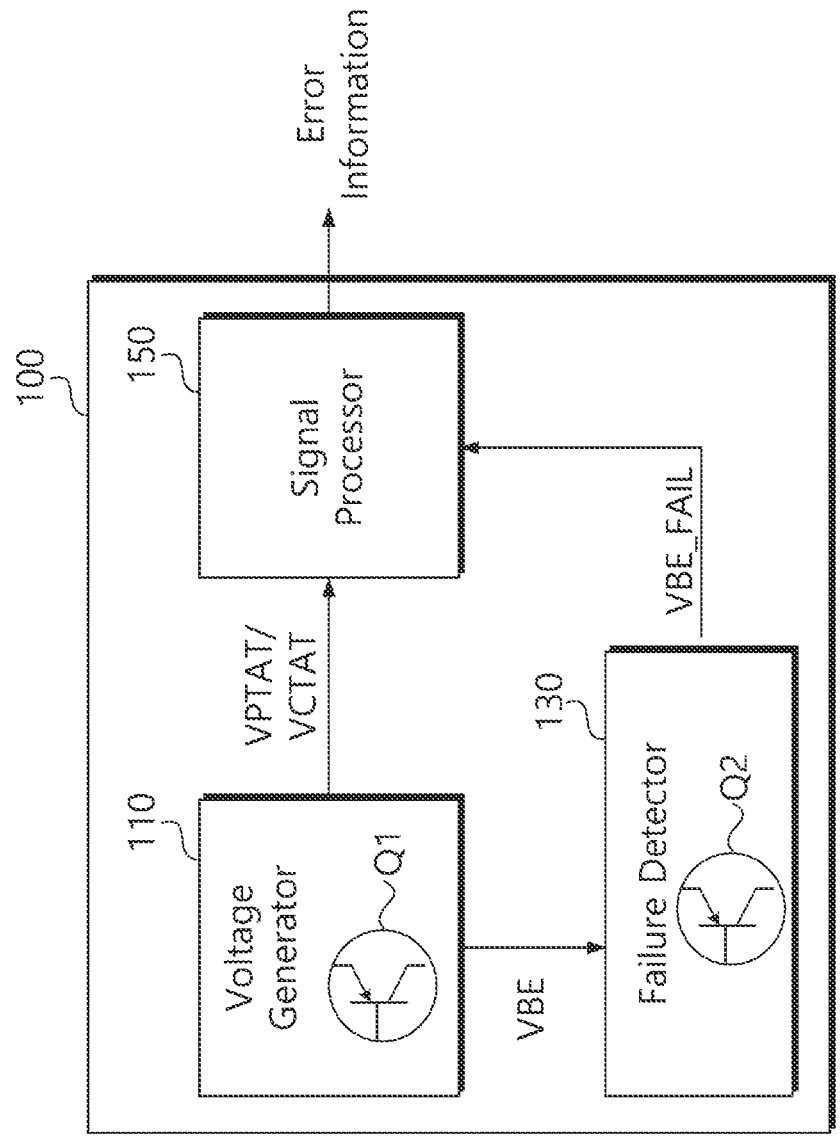
FIG. 1 is a block diagram illustrating a semiconductor device including a failure detector according to an embodiment of the present disclosure.

FIG. 1 is a block diagram illustrating a semiconductor device including a failure detector according to some embodiments of the present disclosure. Referring to FIG. 1, a semiconductor device 100 of the present disclosure may include a voltage generator 110, a failure detector 130, and a signal processor 150.

The voltage generator 110 may generate a voltage that decreases or increases with temperature. For example, the voltage generator 110 may be configured to generate a temperature-complementary voltage VCTAT that decreases with increasing temperature. Alternatively, the voltage generator 110 may be configured to generate a temperature-proportional voltage VPTAT that increases with increasing temperature. The voltage generator 110 may include a bipolar junction transistor Q1. In general, the base-emitter voltage VBE of the bipolar junction transistor Q1 has a complementary to absolute temperature CTAT characteristic that decreases with an increase in temperature. The voltage generator 110 may generate the temperature complementary voltage VCTAT or the temperature proportional voltage VPTAT using the base-emitter voltage VBE of the bipolar junction transistor Q1. Alternatively, the voltage generator 110 may generate both the temperature complementary voltage VCTAT and the temperature proportional voltage VPTAT based on the base-emitter voltage VBE of the bipolar junction transistor Q1, and may generate, using both of the VPTAT and VCTAT, a voltage that is not significantly affected by temperature. Here, the voltage generator 110 has been described with respect to one way to generate a voltage containing temperature information, but the present disclosure is not limited thereto. For example, the voltage generator 110 may be any device, circuit, sensor, detector, intellectual property IP block, system-on-chip SoC, application processor AP, or the like that generates the base-emitter voltage VBE of the bipolar junction transistor Q1. That is, the voltage generator 110 may be any device including the bipolar junction transistor Q1.

The failure detector 130 may monitor the base-emitter voltage VBE of the bipolar junction transistor Q1 generated by the voltage generator 110 to determine whether there is a failure. The failure detector 130 may include a bipolar junction transistor Q2 that operates under the same structure and the same conditions as that of the bipolar junction transistor Q1. The failure detector 130 may determine whether the base-emitter voltage VBE of the bipolar junction transistor Q1 is abnormal by using the reference voltage generated through the bipolar junction transistor Q2. For example, the failure detector 130 may generate an upper limit reference voltage VBE_UP_REF and a lower limit reference voltage VBE_DN_REF by using the base-emitter voltage VBE of the bipolar junction transistor Q2. The failure detector 130 may generate a failure signal VBE_FAIL when the base-emitter voltage VBE of the bipolar junction transistor Q1 is out of the range of the upper limit reference voltage VBE_UP_REF and the lower limit reference voltage VBE_DN_REF. The upper limit reference voltage VBE_UP_REF and the lower limit reference voltage VBE_DN_REF change according to temperature with the same slope as the base-emitter voltage VBE. Accordingly, it may be possible to solve a problem that occurs when the failure of the bipolar junction transistor Q1 is determined using a reference voltage that does not change according to the temperature.

The signal processor 150 may generate information and/or perform a stability operation using at least one of the temperature complementary voltage VCTAT, the temperature proportional voltage VPTAT, and the base-emitter voltage VBE provided from the voltage generator 110. For example, the signal processor 150 may sense the temperature using the temperature proportional voltage VPTAT. Alternatively, the signal processor 150 detect a point in time when a specific temperature is reached by using the temperature proportional voltage VPTAT. However, when the bipolar junction transistor Q1 of the voltage generator 110 fails, the temperature complementary voltage VCTAT or the temperature proportional voltage VPTAT provided from the voltage generator 110 may become unreliable. Accordingly, when the failure signal VBE_FAIL is provided, the signal processor 150 may be configured to recognize that an error exists in the temperature complementary voltage VCTAT or the temperature proportional voltage VPTAT, and can output error information.

As described above, the semiconductor device 100 according to some embodiments of the present disclosure may detect the failure of the bipolar junction transistor Q1 by using a reference voltage that changes according to temperature with the same slope as the base-emitter voltage VBE. In contrast, when using a reference voltage that does not reflect changes in temperature, there may be a problem in that an excessively large margin must be used for the upper and lower reference voltages. Accordingly, a failure occurring in the bipolar junction transistor Q1 may not be detected when the excessively large margin is used. This may become a fatal problem in the case of semiconductors or systems for vehicles. The present disclosure uses the upper limit reference voltage VBE_UP_REF and the lower limit reference voltage VBE_DN_REF that can reflect the change in temperature. Accordingly, it may be possible to use a relatively narrow margin, so that high reliability failure detection of the bipolar junction transistor Q1 is achievable.

Figure 2:
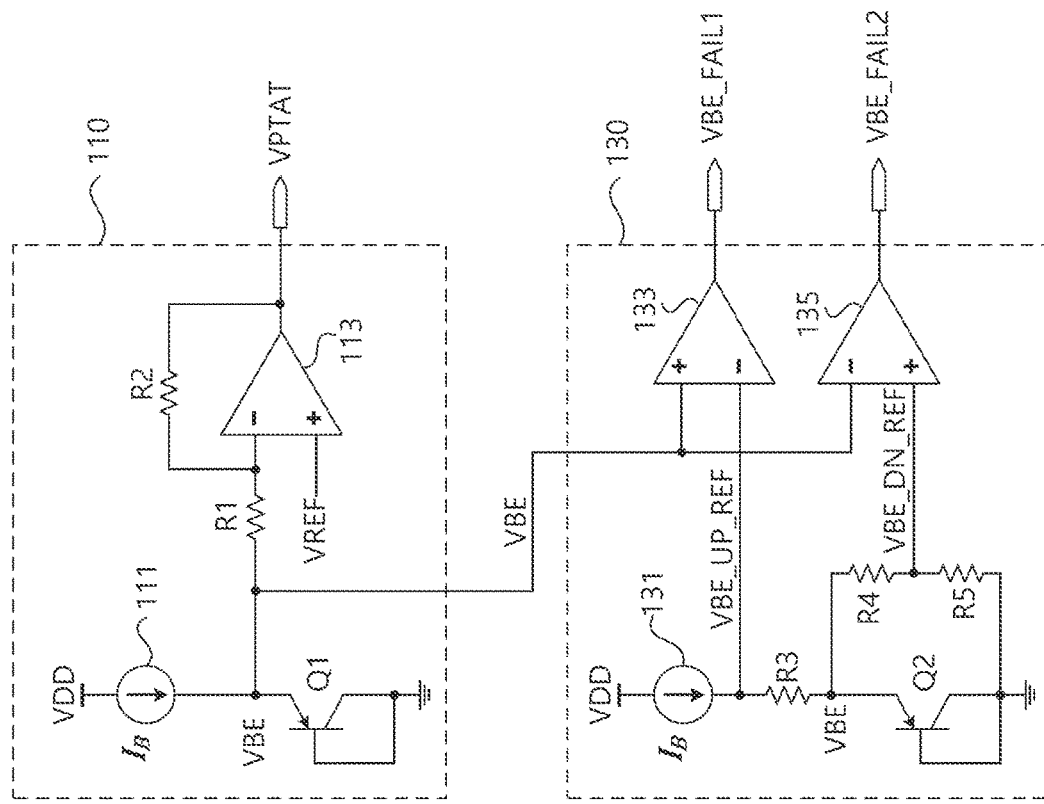
FIG. 2 is a circuit diagram showing a failure detector according to an embodiment of the present disclosure.

FIG. 2 is a circuit diagram showing a failure detector according to some embodiments of the present disclosure. Referring to FIG. 2, the failure detector 130 monitors the base-emitter voltage VBE using the upper limit reference voltage VBE_UP_REF and the lower limit reference voltage VBE_DN_REF that vary according to temperature.

The voltage generator 110 may generate a temperature proportional voltage VPTAT using the base-emitter voltage VBE of the bipolar junction transistor Q1. The voltage generator 110 may include a current source 111, the bipolar junction transistor Q1, and an operational amplifier 113. A bias current $I_B$ may be provided to the diode-connected bipolar junction transistor Q1 by a power supply voltage VDD and the current source 111. The base B and the collector C of the bipolar junction transistor Q1 are both grounded. Then, the base-emitter voltage VBE having a magnitude corresponding to the threshold voltage during forward bias may be formed at the emitter terminal of the bipolar junction transistor Q1.

The base-emitter voltage VBE of the bipolar junction transistor Q1 has a complementary temperature characteristic that decreases as the temperature increases. Accordingly, the resistors R1 and R2 providing negative gain (−R2/R1) and the operational amplifier 113 may be used to generate the temperature proportional voltage VPTAT.

The failure detector 130 may include a current source 131 configured to provide a current having the same magnitude as the bias current $I_B$ of the voltage generator 110. The failure detector 130 may include a bipolar junction transistor Q2, resistors R3, R4, and R5 for voltage division, and comparators 133 and 135. A bias current $I_B$ having the same level as the bias current $I_B$ of the voltage generator 110 may be provided to the diode-connected bipolar junction transistor Q2 by the power supply voltage VDD and the current source 131. The base B and the collector C of the bipolar junction transistor Q2 are both grounded. The base-emitter voltage VBE formed at the emitter terminal of the bipolar junction transistor Q2 is theoretically the same level as the base-emitter voltage VBE of the bipolar junction transistor Q1.

In order to generate the upper limit reference voltage VBE_UP_REF and the lower limit reference voltage VBE_DN_REF based on the base-emitter voltage VBE, a resistor R3 is connected between the emitter terminal E and the current source 131. Resistors R4 and R5 connected in series are inserted between the emitter terminal E and the ground. The upper limit reference voltage VBE_UP_REF may be provided as a sum of the base-emitter voltage VBE and the voltage 'R3×$I_B$' that is formed in the resistor R3 by the bias current $I_B$. The upper limit reference voltage VBE_UP_REF may be expressed as in Equation 1 below.

$$VBE\_UP\_REF = VBE + R \times I_B \qquad \text{[Equation 1]}$$

The lower limit reference voltage VBE_DN_REF may be provided as a voltage VBEX [R5/(R4+R5)] in which the base-emitter voltage VBE is divided by the series resistors R4 and R5. That is, the lower limit reference voltage VBE_DN_REF may be expressed as in Equation 2 below.

$$VBE\_DN\_REF = VBE \times \frac{R5}{R4+R5} \qquad \text{[Equation 2]}$$

The first comparator 133 may compare the upper limit reference voltage VBE_UP_REF with the base-emitter voltage VBE. If the base-emitter voltage VBE becomes higher than the upper limit reference voltage VBE_UP_REF, the first comparator 133 may activate the first failure signal VBE_FAIL1 and/or set the output of the first comparator 133 to a high level 'H'. On the other hand, when the base-emitter voltage VBE is equal to or lower than the upper limit reference voltage VBE_UP_REF, the first comparator 133 may inactivate the first failure signal VBE_FAIL1 and/or set the output of the first comparator 133 to a low level 'L'. The base-emitter voltage VBE may be input to the positive input terminal (+) of the first comparator 133 and the upper limit reference voltage VBE_UP_REF may be input to the negative input terminal (−) of the first comparator 133.

The second comparator 135 may compare the lower limit reference voltage VBE_DN_REF with the base-emitter voltage VBE. If the base-emitter voltage VBE is lower than the lower limit reference voltage VBE_DN_REF, the second comparator 135 may activate the second failure signal VBE_FAIL2 and/or set the output of the second comparator 135 to the high level 'H'. On the other hand, when the base-emitter voltage VBE is equal to or higher than the lower limit reference voltage VBE_DN_REF, the second comparator 135 may inactivate the second failure signal VBE_FAIL2 and/or set the output of the second comparator 135 to the low level 'L'. The base-emitter voltage VBE is input to the negative input terminal (−) of the second comparator 135 and the lower limit reference voltage VBE_DN_REF is input to the positive input terminal (+) of the second comparator 135.

In the above description, the upper limit reference voltage VBE_UP_REF and the lower limit reference voltage VBE_DN_REF based on the base-emitter voltage VBE vary according to temperature. That is, the upper limit reference voltage VBE_UP_REF and the lower limit reference voltage VBE_DN_REF may increase or decrease at the same temperature change rate (or slope) as the base-emitter voltage VBE. In particular, the upper limit reference voltage VBE_UP_REF and the lower limit reference voltage VBE_DN_REF may have a similar tendency to decrease as the temperature increases as the base-emitter voltage VBE, which also decreases as the temperature increases.

In addition, the sizes of the upper limit reference voltage VBE_UP_REF and the lower limit reference voltage VBE_DN_REF may be freely adjusted by adjusting the resistance of the resistors R3, R4, and R5. Since the upper limit reference voltage VBE_UP_REF and the lower limit reference voltage VBE_DN_REF have the same temperature change rate (or slope) as the base-emitter voltage VBE, the upper limit reference voltage VBE_UP_REF and the lower limit reference voltage VBE_DN_REF may be set with a small or relatively smaller detection margin. Accordingly, a failure of the base-emitter voltage VBE can be detected with high or relatively increased reliability with respect to a change in temperature.

PNP-type bipolar junction transistors Q1 and Q2 are shown in FIG. 2 and have been described with respect to example embodiments in explaining the advantages of the present inventive concepts. However, the present inventive concepts are not limited to the disclosure herein and various modifications are possible. That is, although the bipolar junction transistors Q1 and Q2 of the present disclosure have been described as an example of a PNP type generally used in a CMOS semiconductor process, it will be well understood that they may be NPN type bipolar junction transistors.

Figure 3:
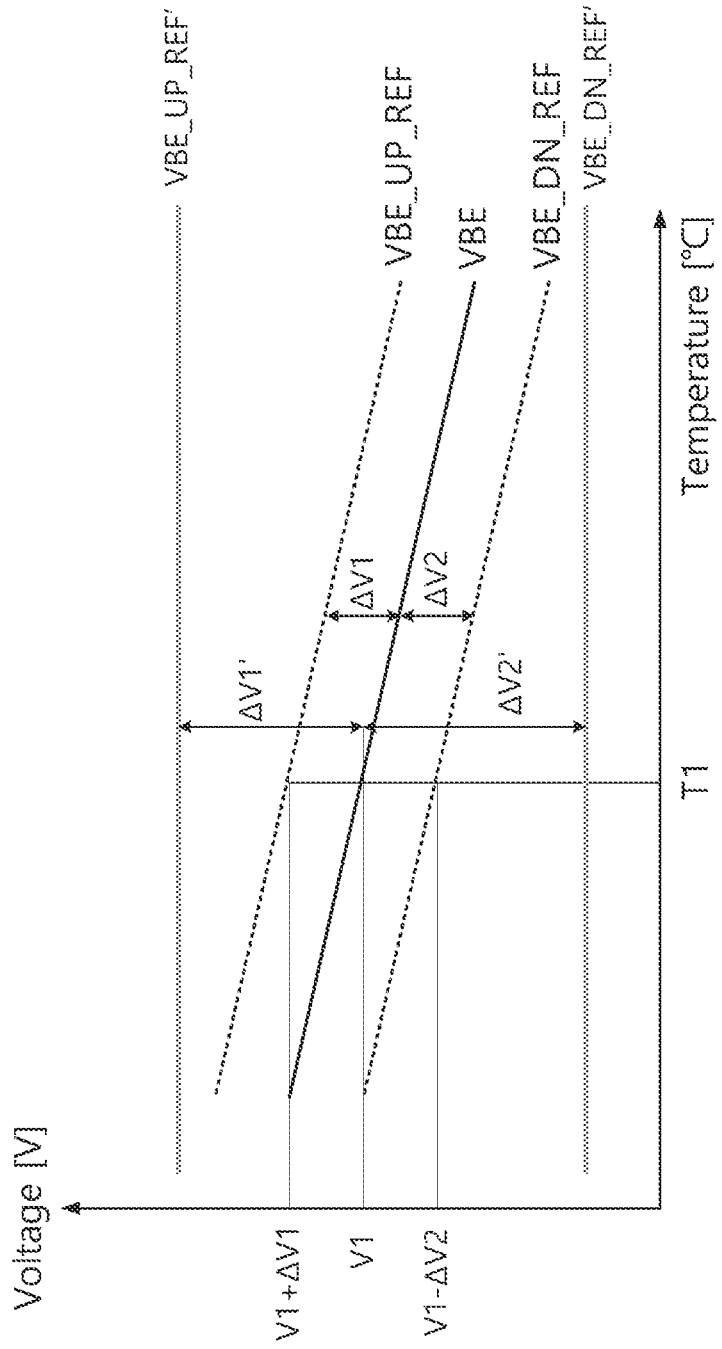
FIG. 3 is a graph exemplarily showing changes according to temperature of the base-emitter voltage VBE, the upper limit reference voltage VBE_UP_REF, and the lower limit reference voltage VBE_DN_REF of FIG. 2.

FIG. 3 is a graph illustrating changes according to temperature of the base-emitter voltage VBE, the upper limit reference voltage VBE_UP_REF, and the lower limit reference voltage VBE_DN_REF of FIG. 2. Referring to FIG. 3, the upper limit reference voltage VBE_UP_REF and the lower limit reference voltage VBE_DN_REF may have the same rate of change with respect to temperature as the base-emitter voltage VBE.

The upper limit reference voltage VBE_UP_REF may be set higher than the base-emitter voltage VBE by the first offset voltage ΔV1 over the entire temperature range as described in Equation 1 above. For example, the upper limit reference voltage VBE_UP_REF may have a magnitude 'VBE+ΔV1' obtained by adding the base-emitter voltage VBE to the first offset voltage ΔV1 formed in the resistor R3 by the bias current $I_B$. The lower limit reference voltage VBE_DN_REF may be set lower than the base-emitter voltage VBE by the second offset voltage ΔV2 over the entire temperature range as expressed in Equation 2 above. For example, the lower limit reference voltage VBE_DN_REF may have a magnitude 'VBE×[R5/(R4+R5)]' in which the base-emitter voltage VBE is divided by the series resistors R4 and R5. That is, the lower limit reference voltage VBE_DN_REF with respect to the temperature axis may be expressed as 'VBE-ΔV2'. Here, the first offset voltage ΔV1 and the second offset voltage ΔV2 may be set identically or may be set differently.

At a specific temperature (e.g., T1), it may be assumed that the base-emitter voltage VBE has a magnitude of 'V1'. Then, at the same temperature T1, the upper limit reference voltage VBE_UP_REF may be generated with a magnitude of 'V1+ΔV1'. Similarly, at the same temperature T1, the lower limit reference voltage VBE_DN_REF may be generated with a magnitude of 'V1-ΔV2'.

It is assumed that the upper limit reference voltage VBE_UP_REF and the lower limit reference voltage VBE_DN_REF are set to 120% and 80% of the base-emitter voltage VBE, respectively. In other words, the first offset voltage ΔV1 that determines the level of the upper limit reference voltage VBE_UP_REF may be 20% of the base-emitter voltage VBE by selecting the bias current $I_B$ and the resistor R3. Similarly, the second offset voltage ΔV2 that determines the level of the lower limit reference voltage VBE_DN_REF may be 20% of the base-emitter voltage by adjusting the ratio of the series resistors R4 and R5 for voltage division.

A fixed upper limit reference voltage VBE_UP_REF' and a fixed lower limit reference voltage VBE_DN_REF' that do not change with temperature are also shown in FIG. 3 for comparison. In this case, sufficient margin must be provided to detect the failure of the base-emitter voltage VBE over the entire temperature range. At a specific temperature T1, when the base-emitter voltage VBE is 'V1', the fixed upper limit reference voltage VBE_UP_REF' must have an offset ΔV1' that is much larger than the first offset voltage ΔV1. In addition, the fixed lower limit reference voltage VBE_DN_REF' must also have an offset ΔV2' that is much larger than the second offset voltage ΔV2. These relatively large offsets ΔV1' and ΔV2' may be factors that deteriorate the precision and reliability of failure detection of the base-emitter voltage VBE.

As seen from comparison with the fixed upper limit reference voltage VBE_UP_REF' and the fixed lower limit reference voltage VBE_DN_REF', the upper limit reference voltage VBE_UP_REF and the lower limit reference voltage VBE_DN_REF of the present inventive concepts can more freely and/or more uniformly set the offset voltages ΔV1 and ΔV2 over the entire temperature range. For more precise failure detection, the magnitudes of the offset voltages ΔV1 and ΔV2 may be further reduced.

Figure 4:
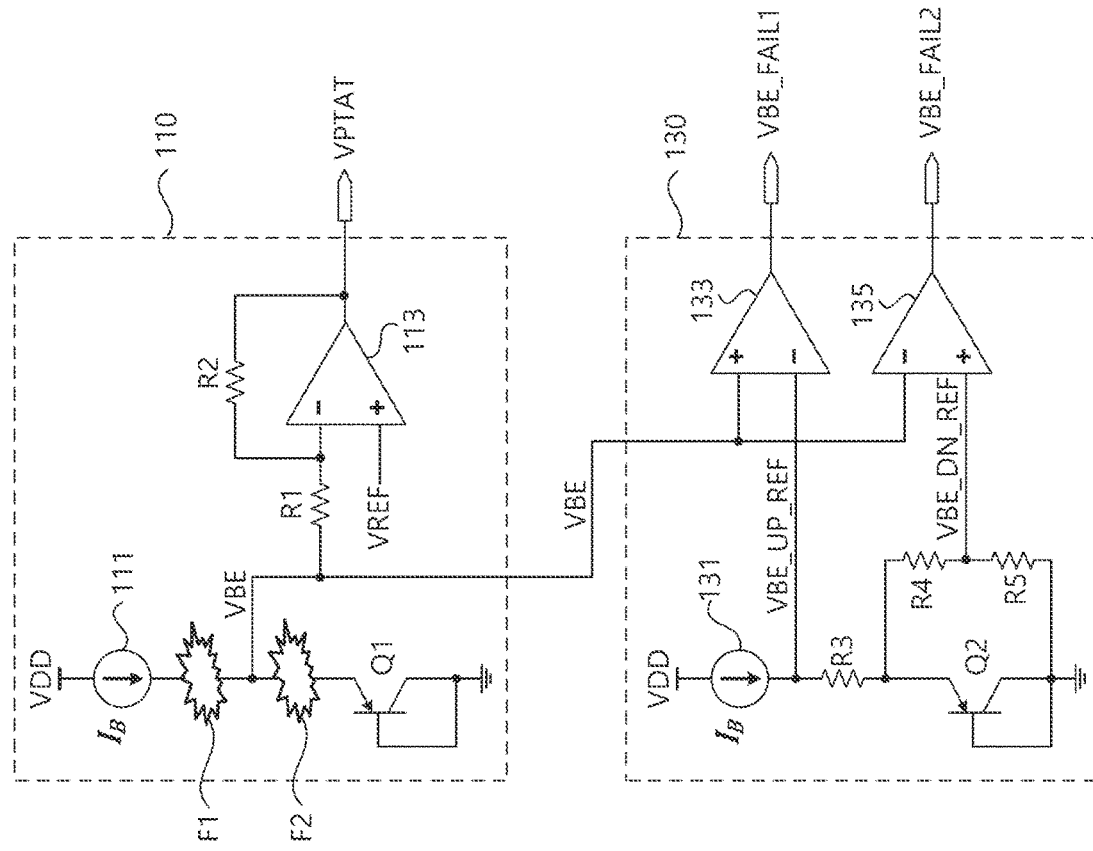
FIG. 4 is a circuit diagram schematically showing examples of failure of a bipolar junction transistor according to an embodiment of the present disclosure.

FIG. 4 is a circuit diagram schematically showing examples of failure of a bipolar junction transistor according to some embodiments of the present inventive concepts. Referring to FIG. 4, wire disconnection failures F1 and F2 that may occur in the bipolar junction transistor Q1 providing the base-emitter voltage VBE of the voltage generator 110 are illustrated as an example of a failure.

If the first disconnection failure F1 occurs, the supply of the bias current $I_B$ to the bipolar junction transistor Q1 may be cut off. Accordingly, the base-emitter voltage VBE formed at the emitter E node of the bipolar junction transistor Q1 will drop without maintaining a fixed value. On the other hand, when the second disconnection failure F2 occurs, the supply of current to the bipolar junction transistor Q1 may be cut off, but the power supply voltage VDD and the bias current $I_B$ at the node to which the base-emitter voltage VBE is output is maintained. Accordingly, the base-emitter voltage VBE will rise rapidly.

Despite the failure of the bipolar junction transistor Q1, the bipolar junction transistor Q2 of the failure detector 130 will operate normally. In addition, the upper limit reference voltage VBE_UP_REF and the lower limit reference voltage VBE_DN_REF may be generated based on the normally generated base-emitter voltage VBE of the bipolar junction transistor Q2 of the failure detector 130. When the first disconnection failure F1 occurs, the base-emitter voltage VBE of Q1 will drop sharply and become lower than the lower limit reference voltage VBE_DN_REF. The first failure signal VBE_FAIL1 output by the first comparator 133 will maintain a low level, and the second failure signal VBE_FAIL2 output by the second comparator 135 will transition to a high level. On the other hand, when the second disconnection failure F2 occurs, the base-emitter voltage VBE of Q1 rapidly rises and becomes higher than the upper limit reference voltage VBE_UP_REF. The first failure signal VBE_FAIL1 output by the first comparator 133 will transition to a high level, and the second failure signal VBE_FAIL2 output by the second comparator 135 will maintain a low level.

In the above, the operation of the failure detector 130 when the wire disconnection failures F1 and F2 of the bipolar junction transistor Q1 occurred has been described as an example. However, the types of failure of the bipolar junction transistor Q1 of the voltage generator 110 are not limited to the above-described examples. Various types of initial defects or progressive defects or failures may occur in the bipolar junction transistor Q1. The failure detector 130 of the present inventive concepts may enable high-reliability failure detection for the bipolar junction transistor Q1 by providing the upper limit reference voltage VBE_UP_REF and the lower limit reference voltage VBE_DN_REF that vary according to temperature.

Figure 5:
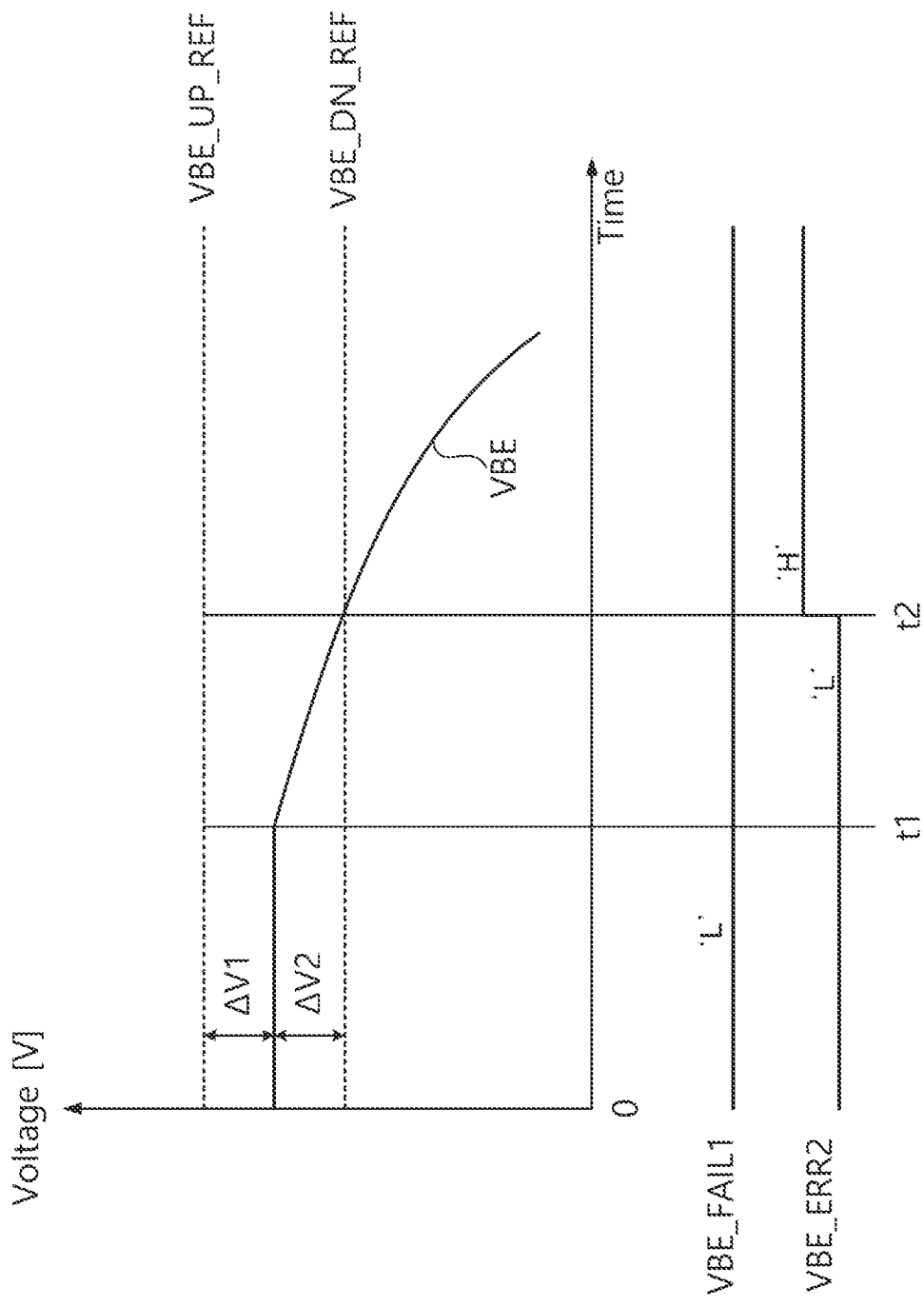
FIG. 5 is a timing diagram exemplarily illustrating a failure detection process of a failure detector in the case of the first disconnection failure F1 of FIG. 4.

FIG. 5 is a timing diagram illustrating a failure detection process of a failure detector in the case of the first disconnection failure F1 of FIG. 4. Referring to FIG. 5, the base-emitter voltage VBE, the upper limit reference voltage VBE_UP_REF, the lower limit reference voltage VBE_DN_REF, and the first failure signal VBE_FAIL1 and the second failure signal VBE_FAIL2 are shown for a case of the first disconnection failure F1 in which the supply of the bias current $I_B$ is cut off Before t1, which is the time of occurrence of the first disconnection failure F1, the base-emitter voltage VBE may maintain constant offsets ΔV1 and ΔV2 with the upper limit reference voltage VBE_UP_REF and the lower limit reference voltage VBE_DN_REF. Accordingly, both the first failure signal VBE_FAIL1 output by the first comparator 133 and the second failure signal VBE_FAIL2 output by the second comparator 135 are maintained at the low level 'L'.

However, as the supply of the bias current $I_B$ to the bipolar junction transistor Q1 is cut off from the time t1 when the first disconnection failure F1 occurs, the base-emitter voltage VBE will drop. At a time t2, the base-emitter voltage VBE of the bipolar junction transistor Q1 will be lower than the lower limit reference voltage VBE_DN_REF. Then, the first failure signal VBE_FAIL1 output by the first comparator 133 may maintain the low level 'L', and the second failure signal VBE_FAIL2 output by the second comparator 135 transitions to the high level 'H'.

The signal processor 150 (refer to FIG. 1) may detect the second failure signal VBE_FAIL2 and may recognize that a problem has occurred in the base-emitter voltage VBE of the voltage generator 110. In addition, the signal processor 150 may stop using the temperature complementary voltage VCTAT or the temperature proportional voltage VPTAT provided from the voltage generator 110 and may output error information to an external destination.

Figure 6:
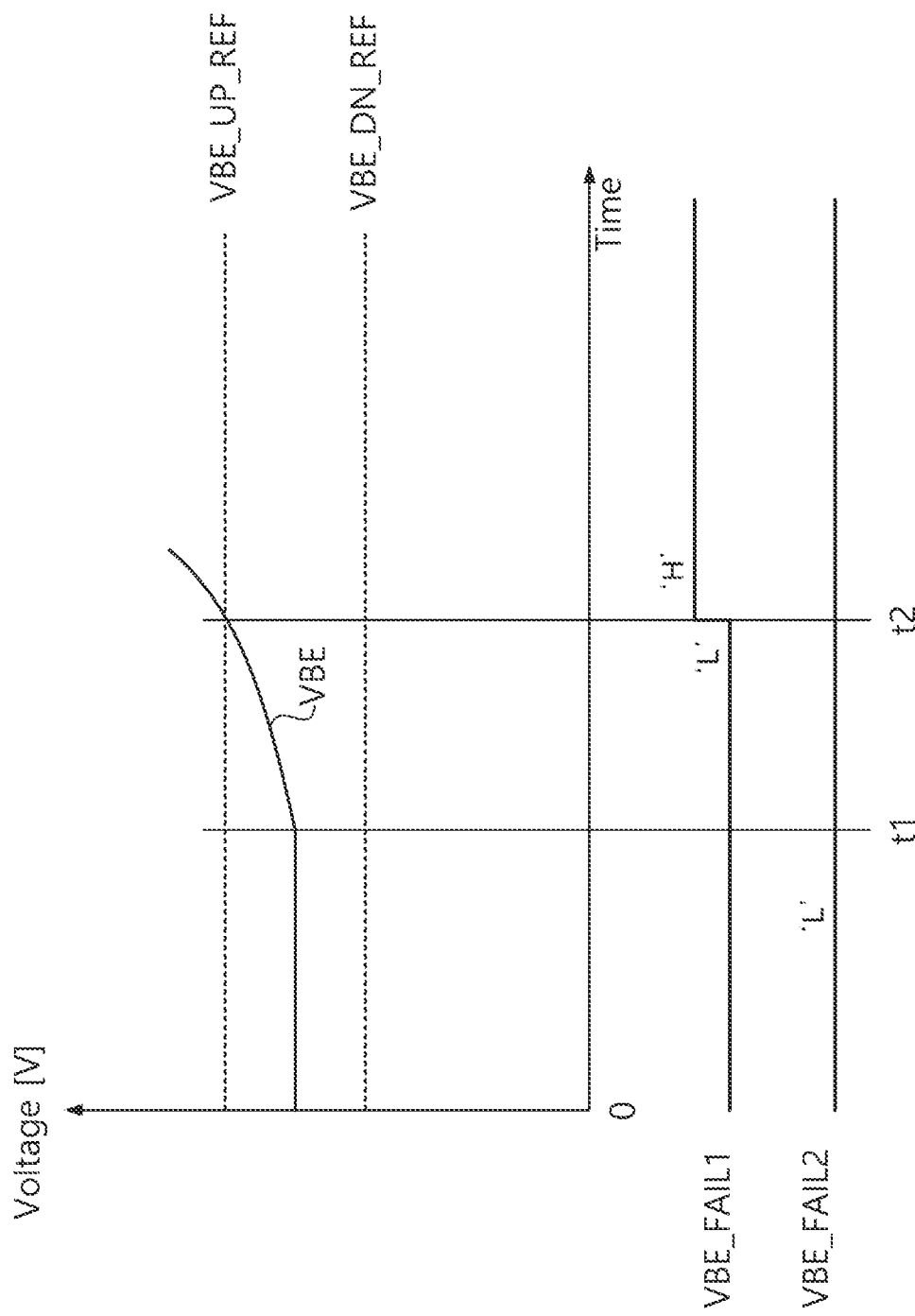
FIG. 6 is a timing diagram exemplarily illustrating a failure detection process of a failure detector in the case of the second disconnection failure F2 of FIG. 4.

FIG. 6 is a timing diagram exemplarily illustrating a failure detection process of a failure detector in the case of the second disconnection failure F2 of FIG. 4. Referring to FIG. 6, the base-emitter voltage VBE, the upper limit reference voltage VBE_UP_REF and the lower limit reference voltage VBE_DN_REF, and the first failure signal VBE_FAIL1 and the second failure signal VBE_FAIL2 are shown for a case of the second disconnection failure F2.

Before t1, which is the time of occurrence of the second disconnection failure F2, the base-emitter voltage VBE may maintain constant offsets ΔV1 and ΔV2 with the upper limit reference voltage VBE_UP_REF and the lower limit reference voltage VBE_DN_REF, respectively. Accordingly, both the first failure signal VBE_FAIL1 output by the first comparator 133 and the second failure signal VBE_FAIL2 output by the second comparator 135 may be maintained at a low level 'L'.

However, from the time t1 when the second disconnection failure F2 occurs, the current flowing into the bipolar junction transistor Q1 may be blocked. Therefore, the base-emitter voltage VBE may rise rapidly. At a time t2, the base-emitter voltage VBE may become higher than the upper limit reference voltage VBE_UP_REF. Then, the first failure signal VBE_FAIL1 output by the first comparator 133 may transition to the high level 'H', and the second failure signal VBE_FAIL2 output by the second comparator 135 may maintain the low level 'L'.

The signal processor 150 (refer to FIG. 1) may detect the transition of the first failure signal VBE_FAIL1 and may recognize that a problem has occurred in the base-emitter voltage VBE of the voltage generator 110. In addition, the signal processor 150 may stop using the temperature complementary voltage VCTAT or the temperature proportional voltage VPTAT provided from the voltage generator 110 and may output error information to an external destination.

Figure 7:
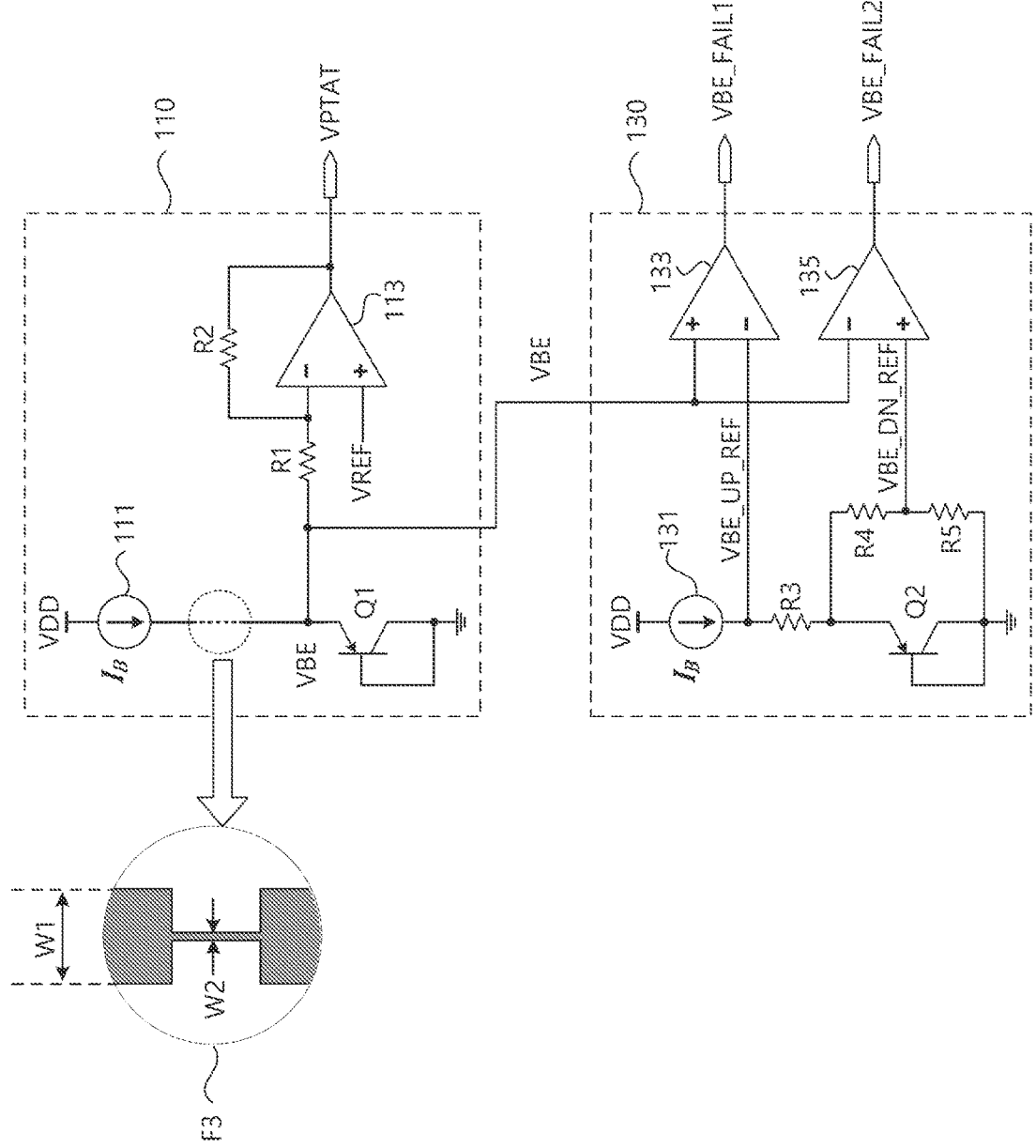
FIG. 7 is a circuit diagram illustrating another example of a failure of a bipolar junction transistor according to an embodiment of the present disclosure.

FIG. 7 is a circuit diagram illustrating another example of a failure of a bipolar junction transistor according to some embodiments of the present disclosure. Referring to FIG. 7, the line width of the line for supplying the bias current $I_B$ in the voltage generator 110 may be excessively narrow, so it may be regarded as a narrow width defect F3 that does not supply sufficient current to the bipolar junction transistor Q1.

The narrow width defect F3 refers to a case in which the line width W2 is excessively narrow compared to the line width W1 of a normal conductive line. In this case, since there is no problem in the operation of the bipolar junction transistor Q1, it may not be detected as a defect during initial production. However, since the current supply to the bipolar junction transistor Q1 is insufficient, it may be difficult to form the base-emitter voltage VBE normally.

When the narrow width defect F3 exists in the conductive line that supplies the bias current $I_B$ to the emitter terminal of the bipolar junction transistor Q1, the bipolar junction transistor Q1 may operate normally under normal conditions. However, the linearity of the base-emitter voltage VBE with respect to temperature may be problematic. In this case, as the temperature increases, the base-emitter voltage VBE of the bipolar junction transistor Q1 may not decrease in parallel with the upper limit reference voltage VBE_UP_REF and the lower limit reference voltage VBE_DN_REF. Accordingly, when the operating temperature of the voltage generator 110 increases, the base-emitter voltage VBE may be out of the range of the upper limit reference voltage VBE_UP_REF and the lower limit reference voltage VBE_DN_REF. As a result, the first failure signal VBE_FAIL1 or the second failure signal VBE_FAIL2 may be generated by the failure detector 130.

Figure 8:
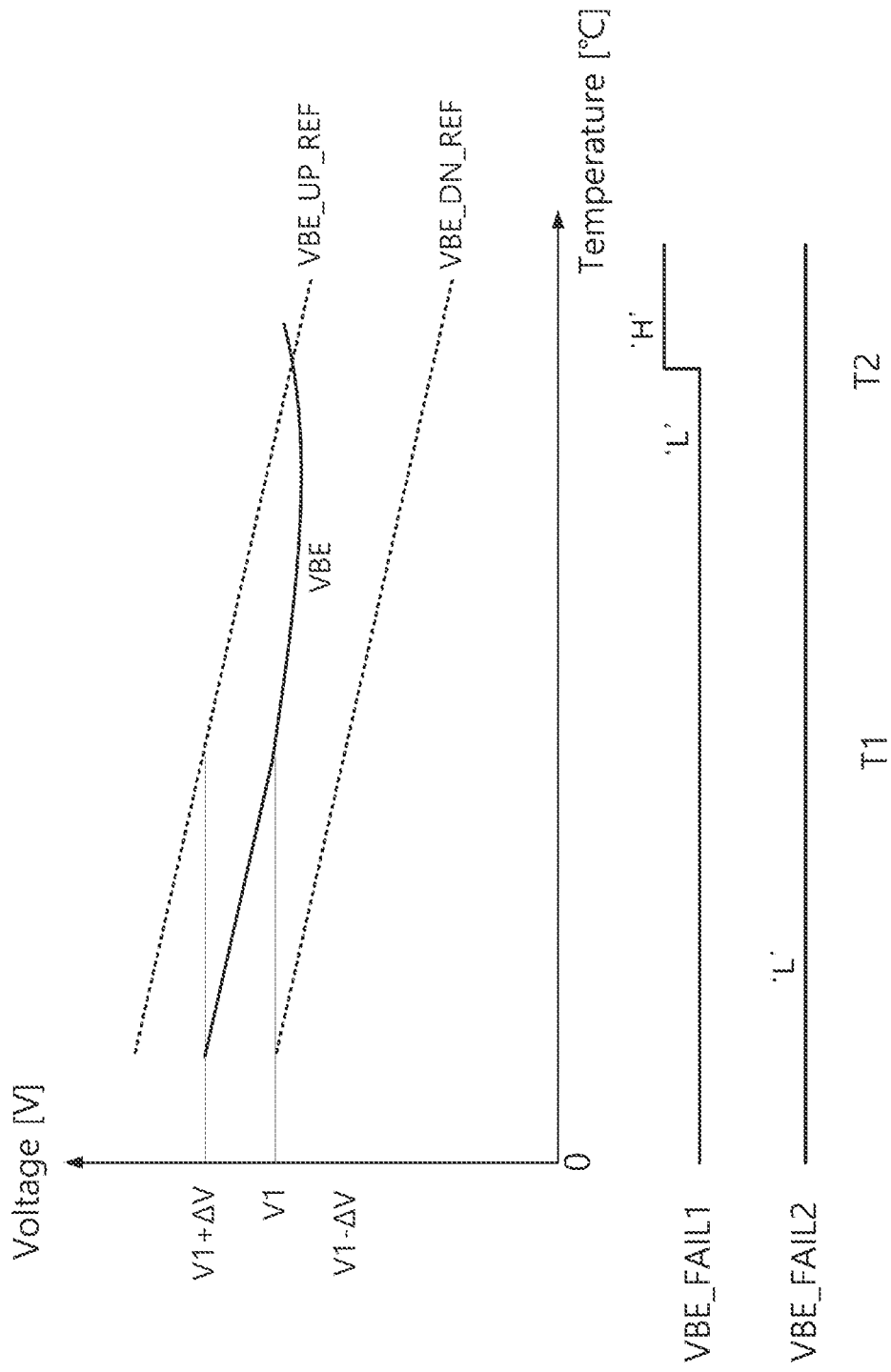
FIG. 8 is a timing diagram exemplarily illustrating a failure detection process of a voltage generator in which a narrow line width defect F3 is present in FIG. 7.

FIG. 8 is a timing diagram illustrating a failure detection process of a voltage generator in which a narrow width defect F3 of FIG. 7 exists. Referring to FIG. 8, waveforms of signals with respect to the temperature are illustrated in a case when the supply of the bias current $I_B$ is not sufficient due to the narrow width defect F3. The illustrated signals include a base-emitter voltage VBE, an upper-limit reference voltage VBE_UP_REF and a lower-limit reference voltage VBE_DN_REF, and a first failure signal VBE_FAIL1 and a second failure signal VBE_FAIL2.

When the narrow width defect F3 exists, the base-emitter voltage VBE may be normally generated in a temperature range lower than the first temperature T1. In this temperature range, the slopes with respect to temperature of the base-emitter voltage VBE, the upper-limit reference voltage VBE_UP_REF, and the lower-limit reference voltage VBE_DN_REF are the same. In other words, even if the temperature changes, the base-emitter voltage VBE may not reach the upper limit reference voltage VBE_UP_REF or the lower limit reference voltage VBE_DN_REF. That is, in a temperature range lower than the first temperature T1, the base-emitter voltage VBE may maintain constant offsets ΔV1 and ΔV2 with the upper limit reference voltage VBE_UP_REF and the lower limit reference voltage VBE_DN_REF, respectively. Accordingly, both the first failure signal VBE_FAIL1 output by the first comparator 133 and the second failure signal VBE_FAIL2 output by the second comparator 135 may be maintained at a low level 'L'.

In the temperature range above the first temperature T1 and below the second temperature T2, the base-emitter voltage VBE of the bipolar junction transistor Q1 may not maintain the offset voltage ΔV1 difference as the temperature increases, and may get closer to the upper limit reference voltage VBE_UP_REF. However, in a temperature range lower than the second temperature T2, the base-emitter voltage VBE may remain lower than the upper limit reference voltage VBE_UP_REF. Accordingly, both the first failure signal VBE_FAIL1 output by the first comparator 133 and the second failure signal VBE_FAIL2 output by the second comparator 135 may be maintained at a low level 'L'.

At a point equal to or higher than the second temperature T2, the base-emitter voltage VBE may be higher than the upper limit reference voltage VBE_UP_REF. Accordingly, the first failure signal VBE_FAIL1 output by the first comparator 133 may transition to the high level 'H'.

Figure 9:
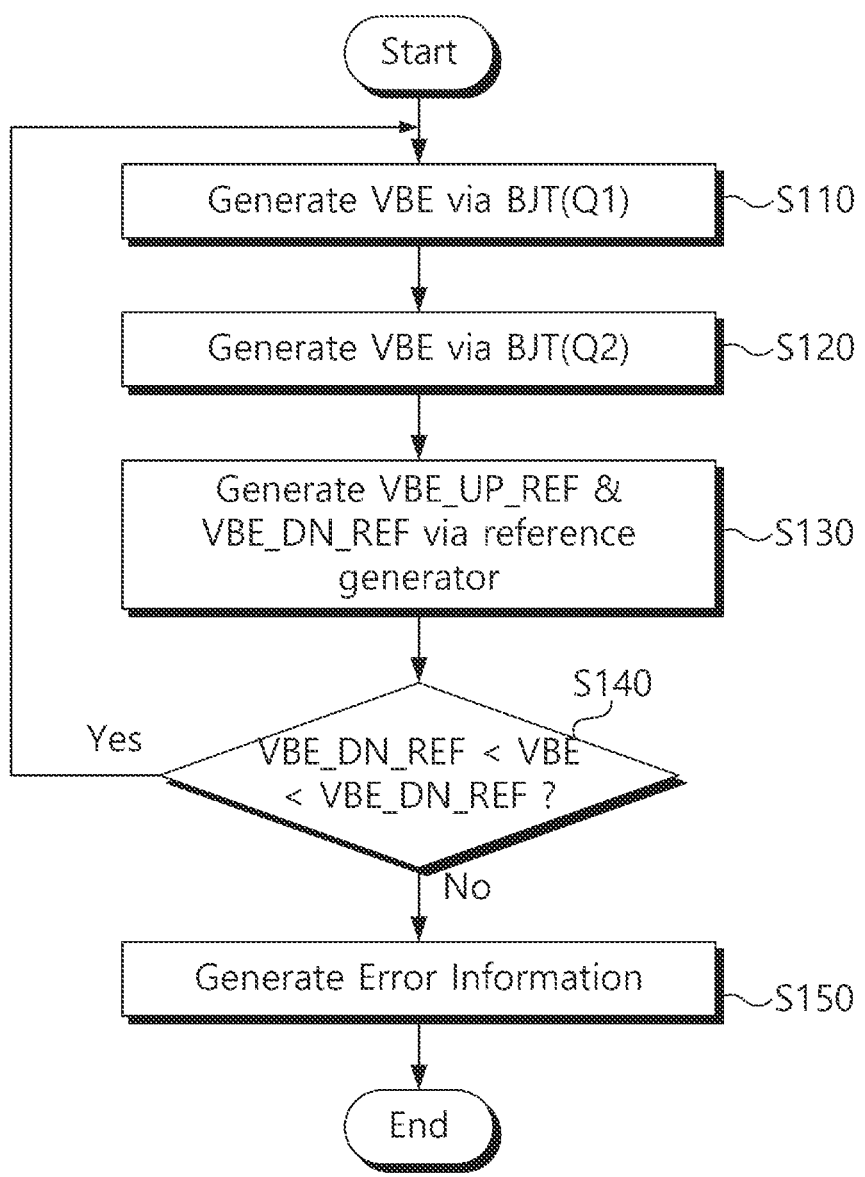
FIG. 9 is a flowchart illustrating a method for detecting a failure of a bipolar junction transistor (BJT) according to an embodiment of the present disclosure.

FIG. 9 is a flowchart illustrating a method for detecting a failure of a bipolar junction transistor BJT according to some embodiments of the present disclosure. Referring to FIG. 2 and FIG. 9, a base-emitter voltage VBE of the bipolar junction transistor BJT (e.g., Q1) of the voltage generator 110 may be generated, and reference voltages VBE_UP_REF and VBE_DN_REF of the failure detector 130 may be generated under the same bias conditions. In addition, high reliability of failure detection of the bipolar junction transistor (BJT) may be possible according to the characteristic that the reference voltages VBE_UP_REF and VBE_DN_REF change with the same slope as the base-emitter voltage VBE with respect to changes in temperature.

In step S110, the base-emitter voltage VBE may be generated by the bipolar junction transistor Q1 of the voltage generator 110 (refer to FIG. 2). The bipolar junction transistor Q1 may use a power supply voltage VDD and the bias current $I_B$. The bipolar junction transistor Q1 may have a base terminal B and a collector terminal C grounded for diode connection, and a bias current $I_B$ may be supplied to the emitter terminal E. In this case, a temperature proportional voltage VPTAT or a temperature complementary voltage CTAT may be generated using the generated base-emitter voltage VBE.

In step S120, the base-emitter voltage VBE may be generated by the bipolar junction transistor Q2 of the failure detector 130 (refer to FIG. 2). The bipolar junction transistor Q2 may be provided with the same bias condition as the bipolar junction transistor Q1 of the voltage generator 110. That is, the bipolar junction transistor Q2 may receive the power supply voltage VDD and the bias current $I_B$. In addition, in the bipolar junction transistor Q2, the base terminal B and the collector terminal C may be grounded for diode connection, and the bias current $I_B$ may be supplied to the emitter terminal E.

In step S130, an upper limit reference voltage VBE_UP_REF and a lower limit reference voltage VBE_DN_REF may be generated based on the base-emitter voltage VBE generated by the bipolar junction transistor Q2 of the failure detector 130. The upper limit reference voltage VBE_UP_REF may be generated using a resistor R3 positioned between the emitter terminal E of the bipolar junction transistor Q2 and the current source 111. In addition, the lower limit reference voltage VBE_DN_REF may be generated by dividing the base-emitter voltage VBE and voltage dividing resistors R4 and R5, as discussed above.

In step S140, the base-emitter voltage VBE generated by the bipolar junction transistor Q1 may be compared with the upper limit reference voltage VBE_UP_REF and the lower limit reference voltage VBE_DN_REF. If the base-emitter voltage VBE is lower than the upper limit reference voltage VBE_UP_REF and higher than the lower limit reference voltage VBE_DN_REF (or in other words, if the base-emitter voltage VBE is between the upper limit reference voltage VBE_UP_REF and the lower limit reference voltage VBE_DN_REF) ('Yes' direction), the procedure returns to step S110. On the other hand, if the base-emitter voltage VBE is greater than or equal to the upper limit reference voltage VBE_UP_REF or less than or equal to the lower limit reference voltage VBE_DN_REF ('No' direction), the procedure moves to step S150.

In step S150, the comparators 133 and 135 (refer to FIG. 2) may generate a first failure signal VBE_FAIL1 or a second failure signal VBE_FAIL2 indicating that the base-emitter voltage VBE is abnormal. Then, the signal processor 150 may generate error information based on the first failure signal VBE_FAIL1 or the second failure signal VBE_FAIL2.

Figure 10:
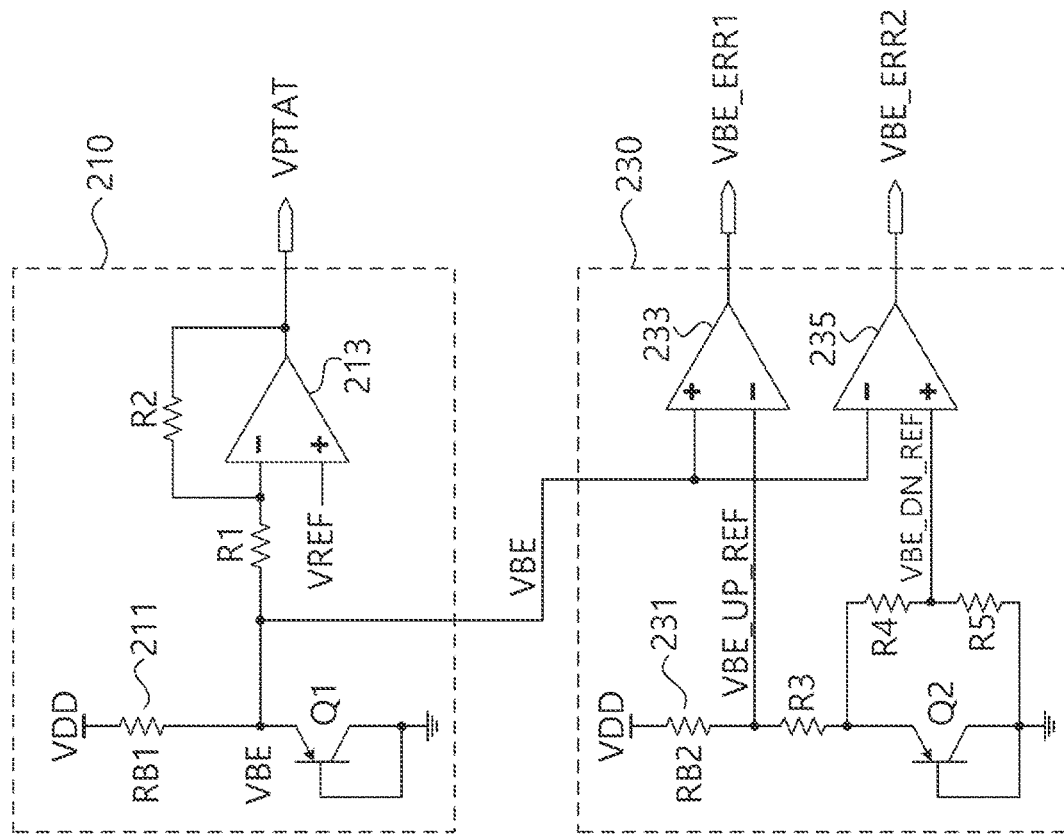
FIG. 10 is a circuit diagram showing a failure detector of a bipolar junction transistor according to another embodiment of the present disclosure.

FIG. 10 is a circuit diagram showing a failure detector of a bipolar junction transistor according to some embodiments of the present disclosure. Referring to FIG. 10, the bipolar junction transistor Q1 of the voltage generator 210 and the bipolar junction transistor Q2 of the failure detector 230 may be connected to respective bias resistors (RB1, RB2). Here, the sizes of the bias resistors RB1 and RB2 may be the same or different.

The voltage generator 210 may generate a temperature proportional voltage VPTAT using the base-emitter voltage VBE of the bipolar junction transistor Q1. The voltage generator may include a first bias resistor RB1, a bipolar junction transistor Q1, and an operational amplifier 213. A current may be provided to the diode-connected bipolar junction transistor Q1 by the power supply voltage VDD and the first bias resistor RB1. The base terminal B and the collector terminal C of the bipolar junction transistor Q1 are both grounded. A base-emitter voltage VBE having a magnitude corresponding to the threshold voltage during forward bias may be formed at the emitter terminal E of the bipolar junction transistor Q1. In addition, a temperature proportional voltage VPTAT may be generated using the base-emitter voltage VBE. In order to generate the temperature proportional voltage VPTAT, resistors R1 and R2 providing negative gains '−R2/R1' and the operational amplifier 213 may be used.

The failure detector 230 may include a second bias resistor RB2, a bipolar junction transistor Q2, resistors R3, R4, and R5, and comparators 233 and 235. The base terminal B and the collector terminal C of the bipolar junction transistor Q2 are both grounded. The base-emitter voltage VBE formed at the emitter terminal E of the bipolar junction transistor Q2 is theoretically the same as that of the bipolar junction transistor Q1.

In order to generate the upper limit reference voltage VBE_UP_REF and the lower limit reference voltage VBE_DN_REF based on the base-emitter voltage VBE, a resistor R3 may be connected between the emitter terminal E and the current source 231. Resistors R4 and R5 connected in series are inserted between the emitter terminal E and ground. The upper limit reference voltage VBE_UP_REF and the lower limit reference voltage VBE_DN_REF may be generated as discussed above with respect to Equations 1 and 2.

The first comparator 233 may compare the upper limit reference voltage VBE_UP_REF with the base-emitter voltage VBE. If the base-emitter voltage VBE becomes higher than the upper limit reference voltage VBE_UP_REF, the first comparator 233 may activate the first failure signal VBE_FAIL1 and/or may output the high level 'H'. On the other hand, when the base-emitter voltage VBE is equal to or lower than the upper limit reference voltage VBE_UP_REF, the first comparator 233 may inactivate the first failure signal VBE_FAIL1 and/or may output the low level 'L'.

The second comparator 235 compares the lower limit reference voltage VBE_DN_REF with the base-emitter voltage VBE. If the base-emitter voltage VBE is lower than the lower limit reference voltage VBE_DN_REF, the second comparator 235 may activate the second failure signal VBE_FAIL2 and/or may output the high level 'H'. On the other hand, when the base-emitter voltage VBE is equal to or higher than the lower limit reference voltage VBE_DN_REF, the second comparator 235 may inactivate the second failure signal VBE_FAIL2 and/or may output the low level 'L'.

In the above description of FIG. 10, it has been described that the bipolar junction transistor Q1 of the voltage generator 210 and the bipolar junction transistor Q2 of the failure detector 230 may use bias resistors RB1 and RB2 instead of current sources. In addition, the bipolar junction transistor Q1 of the voltage generator 210 and the bipolar junction transistor Q2 of the failure detector 230 may be biased in various ways. Bias conditions for generating the base-emitter voltage VBE of the same magnitude may be provided to each of the bipolar junction transistors Q1 and Q2.

Figure 11:
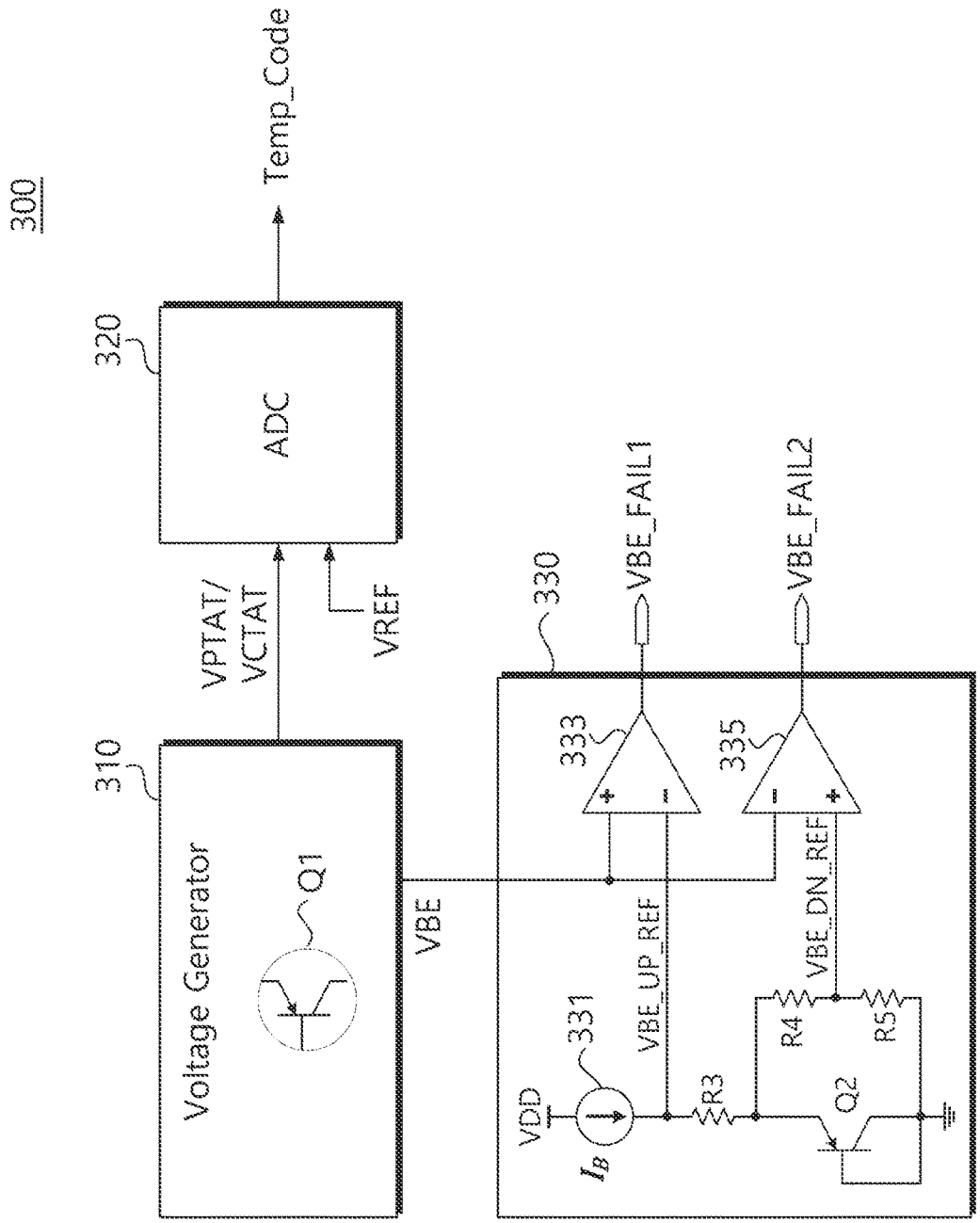
FIG. 11 is a block diagram illustrating a temperature sensor including a failure detector according to an embodiment of the present disclosure.

FIG. 11 is a block diagram illustrating a temperature sensor including a failure detector according to some embodiments of the present disclosure. Referring to FIG. 11, a temperature sensor 300 of the present disclosure may include a voltage generator 310, an analog-to-digital converter ADC 320, and a failure detector 330.

The voltage generator 310 may generate a voltage that decreases or increases with temperature. For example, the voltage generator 310 may be configured to generate a temperature complementary voltage VCTAT whose voltage decrease with increasing temperature. Alternatively, the voltage generator 310 may be configured to generate a temperature proportional voltage VPTAT whose voltage increases with increasing temperature. The voltage generator 310 may include a bipolar junction transistor Q1. A temperature proportional voltage VPTAT or a temperature complementary voltage VCTAT may be generated using the base-emitter voltage VBE of the bipolar junction transistor Q1.

The analog-to-digital converter 320 may convert a temperature proportional voltage (VPTAT) or a temperature complementary voltage VCTAT provided as an analog signal into a digital signal indicating temperature information. For example, the analog-to-digital converter 320 may compare the temperature proportional voltage VPTAT or the temperature complementary voltage VCTAT with the reference voltage VREF and generate or convert the temperature code Temp_Code. The analog-to-digital converter 320 may output current temperature value to an external destination through the temperature code Temp_Code.

The failure detector 330 may monitor the base-emitter voltage VBE of the bipolar junction transistor Q1 generated by the voltage generator 310 and may determine whether the bipolar junction transistor Q1 has failed. To this end, the failure detector 330 may include a bipolar junction transistor Q2 having the same structure as the bipolar junction transistor Q1 and operating under the same bias condition. The failure detector 330 may determine whether the base-emitter voltage VBE of the bipolar junction transistor Q1 is abnormal by using the reference voltage generated through the bipolar junction transistor Q2.

The failure detector 330 may generate an upper limit reference voltage VBE_UP_REF and a lower limit reference voltage VBE_DN_REF by using the base-emitter voltage VBE of the bipolar junction transistor Q2. The failure detector 330 may generate failure signals VBE_FAIL1 and VBE_FAIL2 when the base-emitter voltage VBE of the bipolar junction transistor Q1 is out of the range of the upper limit reference voltage VBE_UP_REF and the lower limit reference voltage VBE_DN_REF.

The failure detector 330 may include a current source 331 and the bipolar junction transistor Q2 of substantially the same size as the bipolar junction transistor Q1 included in the voltage generator 310. The failure detector 330 may include resistors R3, R4, R5 and comparators 333 and 335. A bias current $I_B$ may be provided to the diode-connected bipolar junction transistor Q2 by a power supply voltage VDD and a current source 331 of the same level as that of the voltage generator 310. The base terminal B and the collector terminal C of the bipolar junction transistor Q2 may both be grounded. The base-emitter voltage VBE formed at the emitter terminal E of the bipolar junction transistor Q2 is theoretically the same as that of the bipolar junction transistor Q1 of the voltage generator 310. The generating mechanism of the upper limit reference voltage VBE_UP_REF and the lower limit reference voltage VBE_DN_REF may be substantially the same as that described in FIG. 2. Also, a method of generating the first failure signal VBE_FAIL1 and the second failure signal VBE_FAIL2 using the first comparator 333 and the second comparator 335 may be substantially the same as the description of FIG. 2. Therefore, descriptions thereof will be omitted here in the interest of brevity.

As described above, the temperature sensor 300 according to some embodiments of the present disclosure can detect a failure of the voltage generator 310 for generating the temperature code Temp_Code with high reliability. That is, the failure of the bipolar junction transistor Q1 may be detected using a reference voltage that has the same slope as the base-emitter voltage VBE according to changes in temperature. When using a reference voltage that does not reflect changes in temperature, there may be a problem in that an excessively large margin must be used for the upper and lower reference voltages. Accordingly, a failure occurring in the bipolar junction transistor Q1 may not be detected when an excessively large margin is used. This may become a fatal problem in the case of semiconductors or systems for vehicles and/or directly related to human life. The present inventive concepts may use an upper limit reference voltage VBE_UP_REF and a lower limit reference voltage VBE_DN_REF that can reflect changes in temperature. Accordingly, it may be possible to use a relatively narrow margin, so that a high-reliability failure detection for the bipolar junction transistor Q1 is possible.

Figure 12:
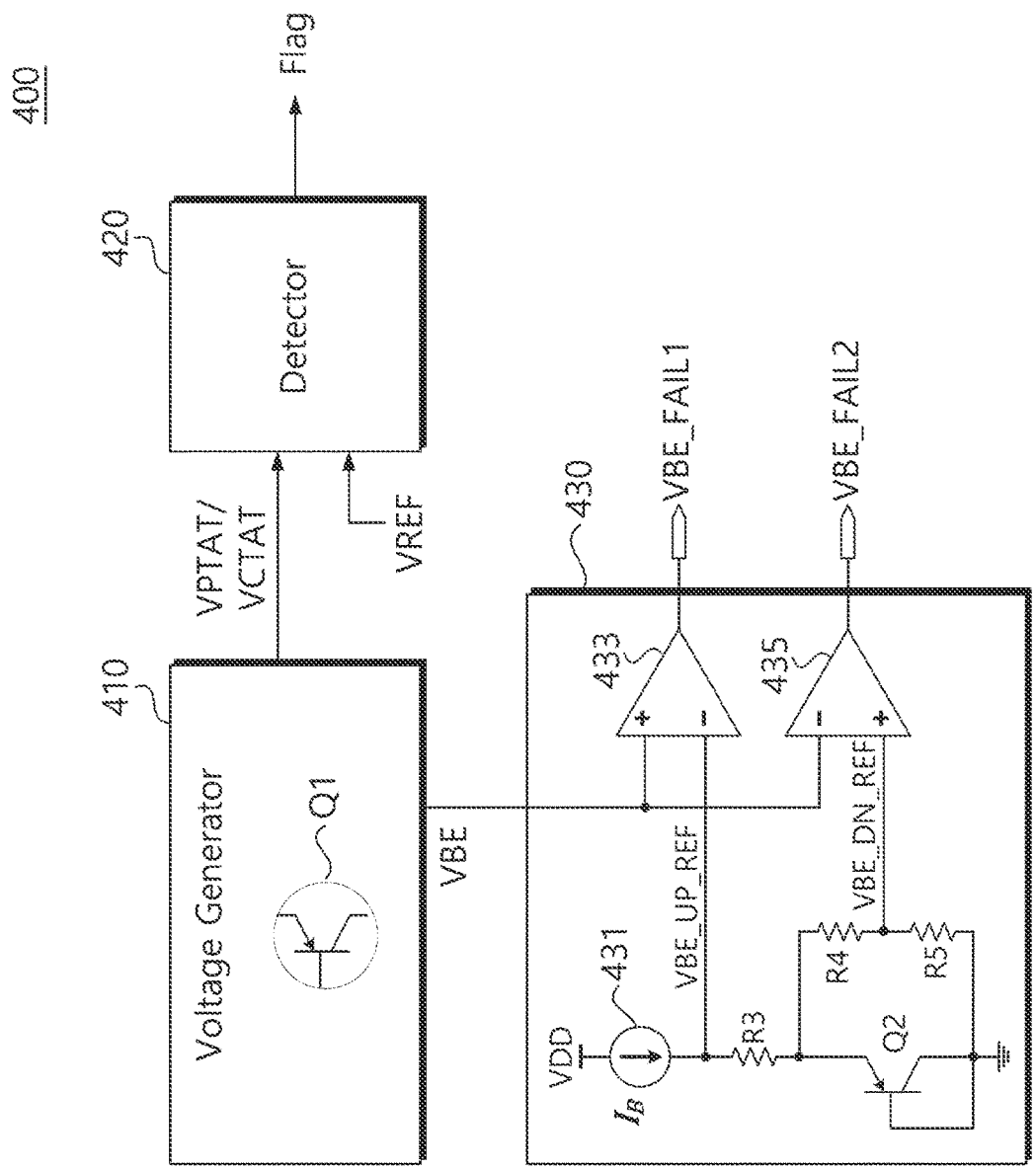
FIG. 12 is a block diagram illustrating a temperature detector including a failure detector according to an embodiment of the present disclosure.

FIG. 12 is a block diagram illustrating a temperature detector including a failure detector according to some embodiments of the present inventive concepts. Referring to FIG. 12, a temperature detector 400 of the present disclosure may include a voltage generator 410, a detector 420, and a failure detector 430.

The voltage generator 410 may generate a voltage that decreases or increases with temperature. For example, the voltage generator 410 may be configured to generate a temperature complementary voltage VCTAT or a temperature proportional voltage VPTAT whose voltage varies according to an increase in temperature. The voltage generator 410 may include a bipolar junction transistor Q1. A temperature proportional voltage VPTAT or a temperature complementary voltage VCTAT may be generated using the base-emitter voltage VBE of the bipolar junction transistor Q1.

The detector 420 may compare the temperature proportional voltage VPTAT or the temperature complementary voltage VCTAT provided as an analog signal with the reference voltage VREF to detect whether a specific temperature is reached. For example, the reference voltage VREF may be provided as a voltage corresponding to a target temperature. The detector 420 may generate a flag signal Flag when the temperature proportional voltage VPTAT or the temperature complementary voltage VCTAT reaches the reference voltage VREF.

The failure detector 430 may monitor the base-emitter voltage VBE of the bipolar junction transistor Q1 generated by the voltage generator 410 to determine whether the bipolar junction transistor Q1 has failed. The failure detector 430 may include a bipolar junction transistor Q2 that operates under the same structure and conditions as that of the bipolar junction transistor Q1. The failure detector 430 may determine whether the base-emitter voltage VBE of the bipolar junction transistor Q1 is abnormal by using the reference voltage generated through the bipolar junction transistor Q2.

The failure detector 430 may include a current source 431 and the bipolar junction transistor Q2 of substantially the same size as the bipolar junction transistor Q1 included in the voltage generator 410. The failure detector 430 may include resistors R3, R4, R5 and comparators 433 and 435. A bias current $I_B$ may be provided to the diode-connected bipolar junction transistor Q2 by a power supply voltage VDD and a current source 431 of the same level as that of the voltage generator 410. The operating mechanism of the failure detector 430 may be substantially the same as that described in FIG. 2. Also, a method of generating the first failure signal VBE_FAIL1 and the second failure signal VBE_FAIL2 using the first comparator 433 and the second comparator 435 may be substantially the same as the description of FIG. 2. Therefore, descriptions thereof will be omitted here in the interest of brevity.

As described above, according to the temperature detector 400 according to some embodiments of the present inventive concepts, the failure of the voltage generator 410 including the bipolar junction transistor Q1 can be detected with high reliability.

Figure 13:
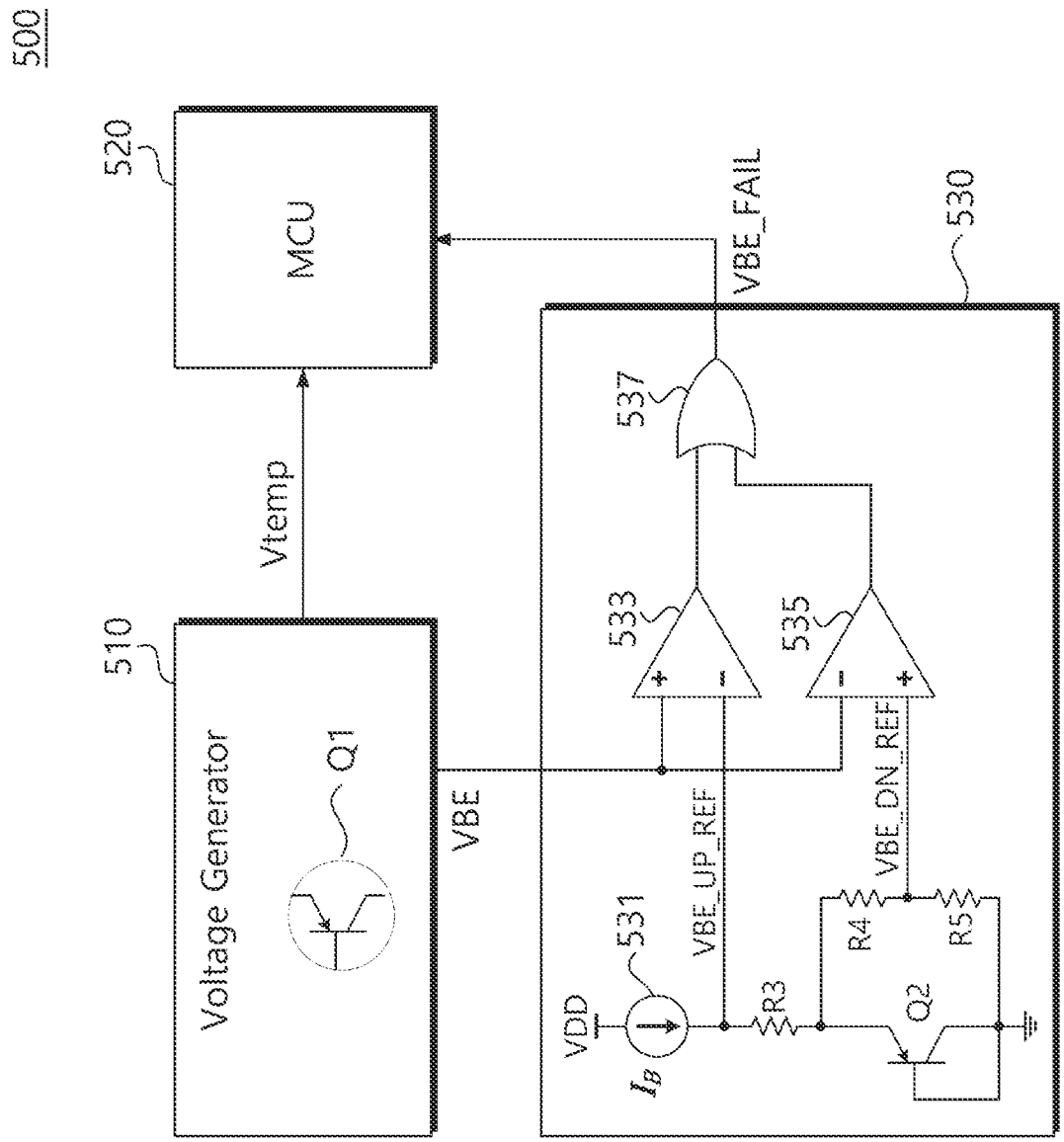
FIG. 13 is a block diagram illustrating a vehicle semiconductor device 500 including a failure detector according to an embodiment of the present disclosure.

FIG. 13 is a block diagram illustrating a vehicle semiconductor device 500 including a failure detector according to some embodiments of the present disclosure. Referring to FIG. 13, a semiconductor device 500 for a vehicle according to the present disclosure may include a voltage generator 510, a micro control unit MCU 520, and a failure detector 530.

The voltage generator 510 may generate a voltage Vtemp that includes temperature information. For example, the voltage generator 510 may be configured to generate a temperature complementary voltage VCTAT or a temperature proportional voltage VPTAT including temperature information. The voltage generator 510 may include a bipolar junction transistor Q1. A temperature proportional voltage VPTAT or a temperature complementary voltage VCTAT may be generated using the base-emitter voltage VBE of the bipolar junction transistor Q1.

The MCU 520 may use a voltage Vtemp including temperature information to adjust a driving system or a sensor of the vehicle. For example, the MCU 520 may control the air conditioner or drivers of the vehicle using the voltage Vtemp including the temperature information.

The failure detector 530 may monitor the base-emitter voltage VBE of the bipolar junction transistor Q1 generated by the voltage generator 510 to determine whether the bipolar junction transistor Q1 has failed. The failure detector 530 may include a bipolar junction transistor Q2 operating under the same structure and conditions as that of the bipolar junction transistor Q1. The failure detector 530 may determine whether the base-emitter voltage VBE of the bipolar junction transistor Q1 is abnormal by using the reference voltage generated through the bipolar junction transistor Q2.

The failure detector 530 may include a current source 531 and the bipolar junction transistor Q2 of substantially the same size as the bipolar junction transistor Q1 included in the voltage generator 510. In addition, the failure detector 530 may include resistors R3, R4, and R5, comparators 533 and 535, and an OR gate 537. A bias current $I_B$ may be provided to the diode-connected bipolar junction transistor Q2 by a power supply voltage VDD and a current source 531 of the same level as that of the voltage generator 510. The base terminal B and the collector terminal C of the bipolar junction transistor Q2 may both be grounded. The base-emitter voltage VBE formed at the emitter terminal E of the bipolar junction transistor Q2 is theoretically the same as that of the bipolar junction transistor Q1 of the voltage generator 510. The generating mechanism of the upper limit reference voltage VBE_UP_REF and the lower limit reference voltage VBE_DN_REF may be substantially the same as that described in FIG. 2. Also, a method of generating the first failure signal VBE_FAIL1 and the second failure signal VBE_FAIL2 using the first comparator 533 and the second comparator 535 may be substantially the same as the description of FIG. 2. Therefore, descriptions thereof will be omitted here in the interest of brevity.

In addition, the first failure signal VBE_FAIL1 and the second failure signal VBE_FAIL2 may be processed by the OR gate 537 and generated as the failure signal VBE_FAIL. The failure signal VBE_FAIL may be used for operation control by the MCU 520.

As described above, in the vehicle semiconductor device 500 according to some embodiments of the present disclosure, the failure detector 530 can detect the failure of the voltage generator 510 including the bipolar junction transistor Q1 with high reliability.

The above are some specific embodiments for carrying out the present inventive concepts. In addition to the above-described embodiments, the present inventive concepts may include simple design changes or easily changeable embodiments. In addition, the present inventive concepts will include techniques that can be easily modified and implemented using the embodiments. Therefore, the scope of the present inventive concepts should not be limited to the above-described embodiments, and should be defined by the claims and equivalents of the claims of the present inventive concepts.

While the present disclosure has been described with reference to embodiments thereof, it will be apparent to those of ordinary skill in the art that various changes and modifications may be made thereto without departing from the scope of the present disclosure as set forth in the following claims.

What is claimed is:
1. A semiconductor device, comprising:
a voltage generator configured to generate a first base-emitter voltage of a first bipolar junction transistor; and a failure detector configured to generate a failure signal by comparing the first base-emitter voltage with an upper limit reference voltage and a lower limit reference voltage;
wherein the failure detector comprises:
a second bipolar junction transistor in which a base terminal and a collector terminal are grounded;
a current source configured to generate a bias current;
a first resistor coupled between the current source and an emitter terminal of the second bipolar junction transistor to generate the upper limit reference voltage;
a second resistor and a third resistor configured to divide a second base-emitter voltage of the second bipolar junction transistor to generate the lower limit reference voltage;
a first comparator configured to compare the first base-emitter voltage with the upper limit reference voltage and configured to generate a first failure signal; and
a second comparator configured to compare the first base-emitter voltage with the lower limit reference voltage and configured to generate a second failure signal.

2. The device of claim 1, wherein the first bipolar junction transistor and the second bipolar junction transistor have the same structure.

3. The device of claim 1, wherein a positive input terminal (+) of the first comparator is configured to receive the first base-emitter voltage, and a negative input terminal (−) of the first comparator is configured to receive the upper limit reference voltage.

4. The device of claim 3, wherein a positive input terminal (+) of the second comparator is configured to receive the lower limit reference voltage, and a negative input terminal (−) of the second comparator is configured to receive the first base-emitter voltage.

5. The device of claim 1, wherein the first and second bipolar junction transistors are PNP type bipolar junction transistors.

6. The device of claim 1, wherein a rate of change with respect to a temperature of the upper limit reference voltage or the lower limit reference voltage is the same as a rate of change with respect to the temperature of the first base-emitter voltage.

7. The device of claim 1, wherein the voltage generator is configured to generate a temperature proportional voltage or a temperature complementary voltage based on the first base-emitter voltage.

8. The device of claim 1, wherein the first bipolar junction transistor and the second bipolar junction transistor are configured to operate under the same bias condition.

9. A semiconductor device, comprising:
a first bipolar junction transistor configured to generate a first base-emitter voltage;
a second bipolar junction transistor configured to generate a second base-emitter voltage;
a reference generator configured to generate at least one reference voltage based on the second base-emitter voltage; and
a comparator configured to compare the generated at least one reference voltage and the first base-emitter voltage and generate a failure signal based on the comparison.

10. The device of claim 9, wherein the reference generator includes:
a first resistor connected between a current source and an emitter terminal of the second bipolar junction transistor to generate an upper limit reference voltage; and
and a second resistor and a third resistor connected between the emitter terminal and a ground, and configured to divide the second base-emitter voltage to generate a lower limit reference voltage.

11. The device of claim 10, wherein the upper limit reference voltage has a magnitude that is a sum of the second base-emitter voltage and a first offset voltage resulting from the first resistor.

12. The device of claim 10, wherein the comparator includes:
a first comparator configured to generate a first failure signal based on a comparison of the first base-emitter voltage with the upper limit reference voltage; and
a second comparator configured to generate a second failure signal based on a comparison of the first base-emitter voltage with the lower limit reference voltage.

13. The device of claim 12, wherein the first base-emitter voltage is input to both a positive input terminal (+) of the first comparator and a negative input terminal (−) of the second comparator.

14. The device of claim 10, wherein a first emitter current is provided to the first bipolar junction transistor and a second emitter current is provided to the second bipolar junction transistor, the first and second emitter currents equally biased such that a rate of change with respect to temperature of each of the upper limit reference voltage and the lower limit reference voltage and a rate of change with respect to temperature of the first base-emitter voltage are the same.

15. The device of claim 14, wherein the first bipolar junction transistor and the second bipolar junction transistor have the same structure.

16. The device of claim 9, wherein a base terminal and a collector terminal of each of the first bipolar junction transistor and the second bipolar junction transistor are grounded.

17. A method for detecting a failure in a semiconductor device using a bipolar junction transistor, comprising:
generating a first base-emitter voltage from a first bipolar junction transistor;
generating a second base-emitter voltage from a second bipolar junction transistor;
generating an upper limit reference voltage and a lower limit reference voltage from the second base-emitter voltage; and
generating, using a comparator, a failure signal based on comparing the first base-emitter voltage with the upper limit reference voltage or the lower limit reference voltage.

18. The method of claim 17, wherein a base terminal and a collector terminal of each of the first bipolar junction transistor and the second bipolar junction transistor are grounded.

19. The method of claim 17, wherein an equal magnitude of current is supplied to emitter terminals of each of the first bipolar junction transistor and the second bipolar junction transistor.

20. The method of claim 17, wherein the first bipolar junction transistor and the second bipolar junction transistor have the same structure.

* * * * *